(12) United States Patent
Lu

(10) Patent No.: US 12,381,115 B2
(45) Date of Patent: Aug. 5, 2025

(54) METHOD FOR FABRICATING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 775 days.

(21) Appl. No.: 17/400,074

(22) Filed: Aug. 11, 2021

(65) Prior Publication Data

US 2022/0301931 A1 Sep. 22, 2022

Related U.S. Application Data

(63) Continuation of application No. PCT/CN2021/106526, filed on Jul. 15, 2021.

(30) Foreign Application Priority Data

Mar. 17, 2021 (CN) .................. 202110286503.X

(51) Int. Cl.
*H01L 21/768* (2006.01)
*H01L 21/311* (2006.01)
(Continued)

(52) U.S. Cl.
CPC .. *H01L 21/76895* (2013.01); *H01L 21/31116* (2013.01); *H01L 21/31144* (2013.01);
(Continued)

(58) Field of Classification Search
CPC ......... H01L 21/76895; H01L 21/31116; H01L 21/31144; H01L 21/76805;
(Continued)

(56) References Cited

U.S. PATENT DOCUMENTS 10,770,465 B1 9/2020 Kim et al.
2002/0105019 A1 8/2002 Mandelman et al.
(Continued)

FOREIGN PATENT DOCUMENTS

CN 102790055 A 11/2012
CN 106611763 A 5/2017
(Continued)

*Primary Examiner* — Jonathan Han
(74) *Attorney, Agent, or Firm* — Kilpatrick Townsend & Stockton LLP

(57) ABSTRACT

Embodiments provide a method for fabricating a semiconductor structure and a semiconductor structure. The method includes: providing a substrate having a plurality of active area; forming a plurality of bit lines arranged at intervals on the substrate, the plurality of bit lines having a plurality of first mask layers; forming a first dielectric layer on the substrate positioned between adjacent two of the plurality of bit lines; patterning the first dielectric layer, to form a plurality of first notches arranged at intervals on the first dielectric layer; forming a second mask layer on the first dielectric layer, and the second mask layer encircling in each of the plurality of first notches to form a second notch; forming a plurality of contact holes arranged at intervals in the first dielectric layer; and forming a conductive plunger in each of the plurality of contact holes.

15 Claims, 13 Drawing Sheets

(51) Int. Cl.
*H01L 23/528* (2006.01)
*H01L 23/532* (2006.01)
*H01L 23/535* (2006.01)

(52) U.S. Cl.
CPC .. *H01L 21/76805* (2013.01); *H01L 21/76816* (2013.01); *H01L 23/5283* (2013.01); *H01L 23/535* (2013.01); *H01L 23/53266* (2013.01); *H01L 23/53271* (2013.01)

(58) Field of Classification Search
CPC ......... H01L 21/76816; H01L 21/76831; H01L 21/32139; H01L 23/5283; H01L 23/535; H01L 23/53266; H01L 23/53271; H01L 2924/1437; H01L 2924/145; H01L 2924/1451; H01L 27/092–0928; H01L 28/40–92; H10B 12/00; H10B 12/20; H10B 12/30–395; H10B 12/01; H10B 12/02; H10B 12/03–0387; H10B 12/05; H10B 12/053; H10B 12/056; H10B 12/48–488; H10B 12/09; H10B 12/50; H10B 12/10; H10B 10/00; H10B 10/12; H10B 10/125; H10B 10/15; H10B 10/18; H10B 20/00; H10B 20/20; H10B 20/27; H10B 20/30–387; H10B 69/00; H10B 53/00–50; H10B 41/00–50; H10B 41/60; H10B 41/70; H10B 43/00; H10B 43/10; H10B 43/30–50; H10B 43/20–27; H10B 51/00–50; G11C 11/41–419; G11C 11/401–4099; G11C 14/0009–0045; G11C 2211/4016; G11C 17/10–126; G11C 16/00–349

See application file for complete search history.

(56) References Cited

U.S. PATENT DOCUMENTS

| | | | |
|---|---|---|---|
| 2008/0064206 | A1 | 3/2008 | Seo et al. |
| 2020/0357803 | A1* | 11/2020 | Surthi ................... H01L 23/528 |
| 2020/0411318 | A1* | 12/2020 | Lee ........................ H10B 12/09 |
| 2021/0375933 | A1* | 12/2021 | Lu .......................... H10B 51/20 |
| 2022/0102528 | A1* | 3/2022 | Kim ..................... H01L 29/4236 |
| 2023/0245896 | A1* | 8/2023 | Gupta ................. C23C 16/5096 |
| | | | 438/680 |

FOREIGN PATENT DOCUMENTS

| | | |
|---|---|---|
| CN | 106941097 A | 7/2017 |
| CN | 111584488 A | 8/2020 |
| CN | 112447604 A | 3/2021 |

\* cited by examiner

METHOD FOR FABRICATING SEMICONDUCTOR STRUCTURE, AND SEMICONDUCTOR STRUCTURE

CROSS-REFERENCE TO RELATED APPLICATION

This application is a continuation of PCT/CN2021/106526, filed on Jul. 15, 2021, which claims priority to Chinese Patent Application No. 202110286503.X titled "METHOD FOR FABRICATING SEMICONDUCTOR STRUCTURE, AND SEMICONDUCTOR STRUCTURE" and filed to the State Intellectual Property Office on Mar. 17, 2021, the entire contents of which are incorporated herein by reference.

TECHNICAL FIELD

The present disclosure relates to the field of semiconductor technologies, and more particularly, to a method for fabricating a semiconductor structure, and a semiconductor structure.

BACKGROUND

With the constant development of semiconductor technologies and storage technologies, electronic devices continue to develop towards miniaturization and integration. Dynamic random access memory (DRAM) is widely applied to various electronic devices due to its higher storage density and faster read-write speed. The DRAM generally includes a plurality of duplicate memory cells, wherein each of the plurality of memory cells includes a capacitor and a transistor. A gate of the transistor is connected to a word line, a drain of the transistor is connected to a bit line, and a source of the transistor is connected to the capacitor. A voltage signal on the word line can control the transistor to be enabled or disabled, and then can read, by means of the bit line, data information stored in the capacitor, or write the data information into the capacitor for storage by means of the bit line.

In the related technologies, the transistor is provided in a substrate, and a conductive plunger is provided on the substrate. The conductive plunger is positioned between adjacent bit lines. One terminal of the conductive plunger is connected to the source of the transistor, and the other terminal of the conductive plunger is connected to the capacitor, to implement an electrical connection between the capacitor and the source of the transistor.

However, the above processes for fabricating the conductive plunger are relatively cumbersome, which may increase fabrication costs of a semiconductor structure.

SUMMARY

A first aspect of embodiments of the present disclosure provides a method for fabricating a semiconductor structure, wherein the method includes following steps:
providing a substrate, the substrate comprising a plurality of active area;
forming a plurality of bit lines arranged at intervals on the substrate, the plurality of bit lines having a plurality of first mask layers;
forming a first dielectric layer on the substrate positioned between adjacent two of the plurality of bit lines, the first dielectric layer covering the plurality of bit lines and the substrate;
patterning the first dielectric layer, to form a plurality of first notches arranged at intervals on the first dielectric layer;
forming a second mask layer on the first dielectric layer, the second mask layer encircling in each of the plurality of first notches to form a second notch;
removing the first dielectric layer positioned under the second notch to form a plurality of contact holes arranged at intervals in the first dielectric layer, each of the plurality of contact holes extending into the substrate to expose a part of the plurality of active area; and
forming a conductive plunger in each of the plurality of contact holes, the conductive plunger being in contact with each of the plurality of active area.

A second aspect of the embodiments of the present disclosure provides a semiconductor structure fabricated by means of the aforementioned method for fabricating a semiconductor structure. The semiconductor structure comprises: a substrate, which comprises a plurality of active area arranged at intervals;
a plurality of bit lines, the plurality of bit lines being arranged on the substrate, and a part of bottom walls of the plurality of bit lines being in contact with the plurality of active area;
a first dielectric layer, the first dielectric layer covering the plurality of bit lines and the substrate, the first dielectric layer positioned between adjacent two of the plurality of bit lines being internally provided with a plurality of contact holes arranged at intervals, the plurality of contact holes extending into the substrate to expose a part of the plurality of active area; and
a conductive plunger, arranged in each of the plurality of contact holes.

In the method for fabricating a semiconductor and a semiconductor structure provided by the embodiments of the present disclosure, the first dielectric layer is formed on the substrate, the first dielectric layer covers the plurality of bit lines and the substrate, and the plurality of contact holes for arranging the conductive plunger are formed in the first dielectric layer. In this way, the first dielectric layer not only can serve as an isolation spacer between adjacent two of the plurality of bit lines, but also can serve as an isolation structure between the adjacent conductive plungers, which simplifies fabrication processes of the conductive plungers and reduces production costs compared with the related technologies where it is required to separately fabricate the isolation spacer between the adjacent bit lines and the isolation structure between the adjacent conductive plungers.

In addition, in some embodiments of the present disclosure, the second mask layer is also formed on the first dielectric layer, and the second notch is formed in each of the plurality of first notches. A size and a shape of the conductive plunger are defined by means of the second notch, to facilitate forming the plurality of off-round contact holes, and then forming the off-round conductive plunger. Compared with the rectangular conductive plunger in the related technologies, the size of the conductive plunger can be reduced, and electric leakage at corners of the conductive plunger can be prevented.

In addition to the technical problems solved by the embodiments of the present disclosure described above, technical features constituting technical solutions and beneficial effects brought by the technical features of these technical solutions, other technical problems that can be solved by the method for fabricating a semiconductor and the semiconductor structure provided by the embodiments of the present disclosure, other technical features included in the technical solutions and beneficial effects brought by these technical features will be described in further detail in the some implementations.

Figure 1:
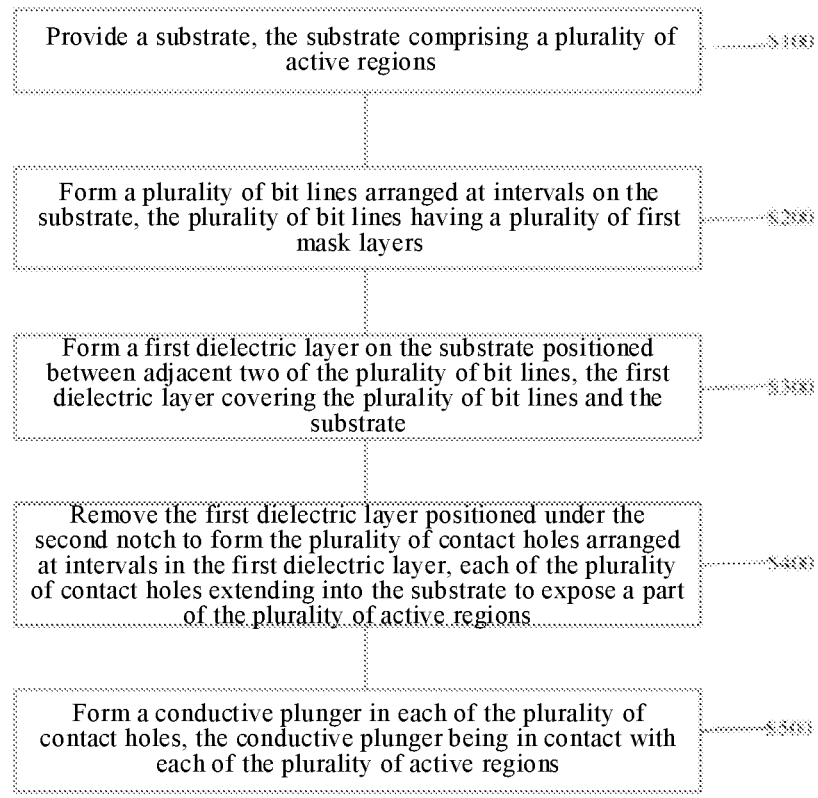
FIG. 1 is a flowchart of a method for fabricating a semiconductor structure according to an embodiment of the present disclosure.

Reference numerals in the attached drawings:

| | |
|---|---|
| 10: substrate; | 11: active area; |
| 12: isolation structure; | 20: bit line; |
| 21: initial bit line layer; | 211: initial barrier layer; |
| 212: initial conductive layer | 213: initial insulating layer; |
| 22: initial mask layer; | 221: first mask layer; |
| 23: second photoresist layer; | 30: first dielectric layer; |
| 31: first notch; | 40: first photoresist layer; |
| 41: first opening; | 50: second mask layer; |
| 51: second notch; | 60: contact hole; |
| 61: first intermediate hole; | 62: second intermediate hole; |
| 70: second dielectric layer; | 71: silicon oxide layer; |
| 72: silicon nitride layer; | 80: conductive plunger. |

DETAILED DESCRIPTION

In a fabrication process of a semiconductor structure, generally a plurality of bit lines arranged at intervals are formed on a substrate first, then a first dielectric layer is respectively formed on two sides of the plurality of bit lines, and a silicon oxide layer is formed on the substrate by means of a deposition process, wherein the silicon oxide layer covers the plurality of bit lines and the first dielectric layer. Finally, the silicon oxide layer is patterned to form a plurality of contact holes arranged at intervals in the silicon oxide layer, and each of the plurality of contact holes is positioned between adjacent two of the plurality of bit lines.

After the plurality of contact holes are formed, a second dielectric layer is formed on an inner wall of each of the plurality of contact holes by means of a deposition process, then the silicon oxide layer is removed, and finally an electrically conductive material is deposited in the plurality of contact holes to form a conductive plunger. However, two deposition processes are required in the above method for fabricating a semiconductor structure, wherein one deposition process is configured for forming the first dielectric layer, and the other deposition process is configured for forming the second dielectric layer. Thus this method has the disadvantage of cumbersome processes.

In view of the above technical problems, embodiments of the present disclosure provide a method for fabricating a semiconductor structure, and a semiconductor structure. The first dielectric layer is formed on the substrate, the first dielectric layer covers the plurality of bit lines and the substrate, and the plurality of contact holes are formed in the first dielectric layer. In this way, the first dielectric layer not only can serve as an isolation spacer between adjacent two of the plurality of bit lines, but also can serve as an isolation structure between the adjacent conductive plungers, which can simplify fabrication processes of the conductive plungers compared with the technical solution in the related technologies where it is required to separately deposit dielectric layers twice.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 2:
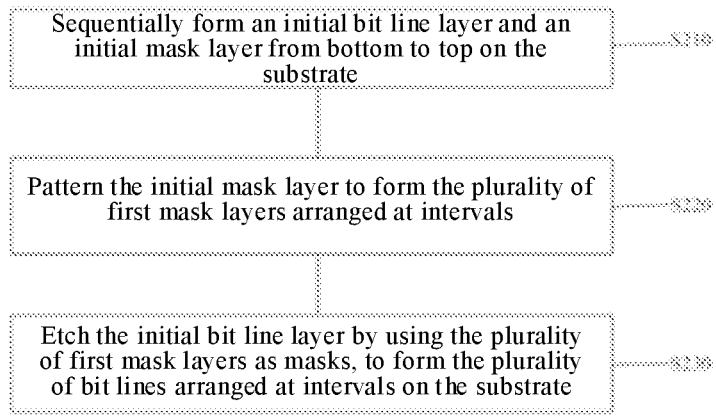
FIG. 2 is a flowchart of forming a plurality of bit lines in the method for fabricating a semiconductor structure according to an embodiment of the present disclosure.

FIG. 1 is a flowchart of a method for fabricating a semiconductor structure according to an embodiment of the present disclosure, FIG. 2 is a flowchart of forming a plurality of bit lines in the method for fabricating a semiconductor structure according to an embodiment of the present disclosure, and FIGS. 3-24 are schematic diagrams of the method for fabricating a semiconductor structure in different phases. The method for fabricating a semiconductor structure is described in detail below with reference to FIGS. 3 to 24.

Figure 3:
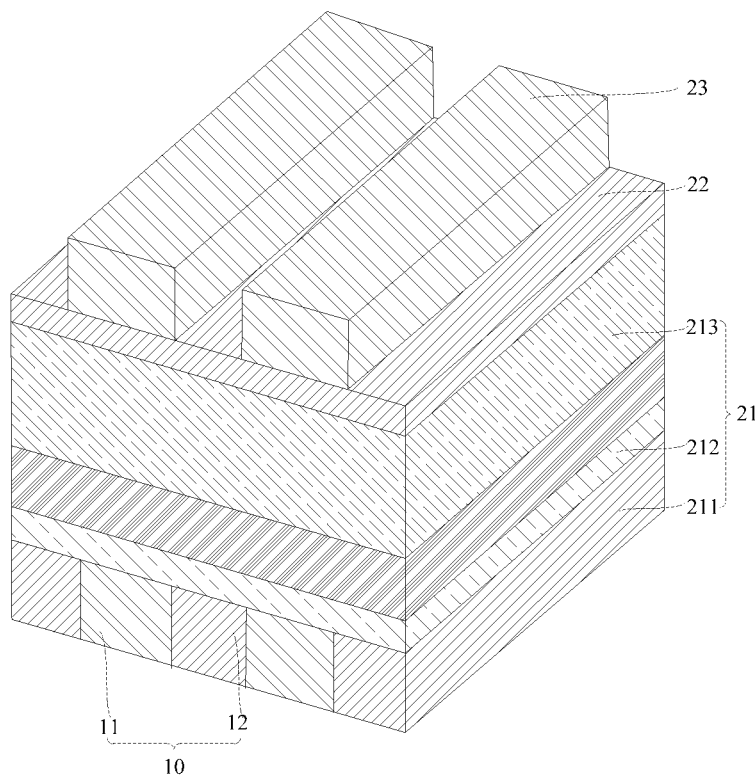
FIG. 3 is a three-dimensional diagram of an initial bit line layer and an initial mask layer formed in the method for fabricating a semiconductor structure according to an embodiment of the present disclosure.
Figure 4:
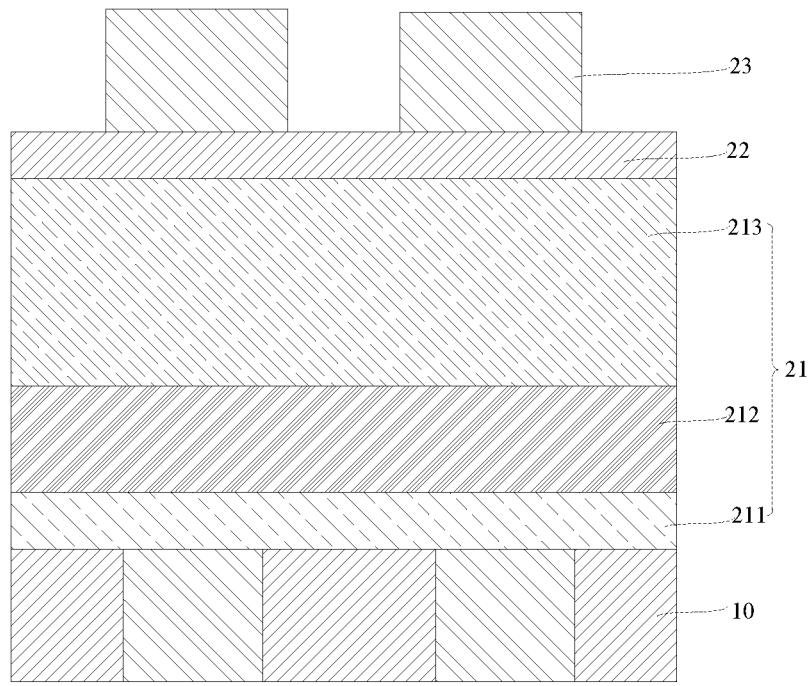
FIG. 4 is a principal view of FIG. 3.

Step S100: providing a substrate, the substrate comprising a plurality of active area. Exemplarily, as shown in FIG. 3 and FIG. 4, as a supporting component of a memory, the substrate 10 is configured to support other components provided thereon. The substrate 10 may be made from a semiconductor material, wherein the semiconductor material may be one or more of silicon, germanium, silicon-germanium compounds and silicon-carbon compounds.

The substrate 10 is provided with a plurality of active area 11, wherein the plurality of active area 11 are configured to form transistors in the semiconductor structure. The plurality of active area 11 are arranged at intervals on the substrate 10, to improve utilization rate of the substrate and density of memory cells.

To implement insulation arrangement between adjacent two of the plurality of active area 11, an isolation structure 12 may be arranged between adjacent two of the plurality of active area 11. For example, shallow trench isolation may be provided between adjacent two of the plurality of active area 11.

Step S200: forming a plurality of bit lines arranged at intervals on the substrate, the plurality of bit lines having a plurality of first mask layers. This step may be performed in accordance with the following process.

Exemplarily, as shown in FIG. 2, Step S210: sequentially forming an initial bit line layer and an initial mask layer from bottom to top on the substrate.

As shown in FIG. 3, the initial bit line layer 21 and the initial mask layer 22 may be sequentially formed on the substrate 10 by means of an atomic layer deposition process, a chemical vapor deposition process, or a physical vapor deposition process, wherein the initial bit line layer 21 may be a stacked layer structure. For example, the initial bit line layer 21 may include an initial barrier layer 211, an initial conductive layer 212, and an initial insulating layer 213.

The initial barrier layer 211 is arranged on the substrate 10, and the initial barrier layer 211 can prevent the electrically conductive material in the initial conductive layer 212 from penetrating into the substrate 10, ensuring a conductive performance of the initial conductive layer 212, thereby improving yield of the semiconductor structure. Exemplarily, a material of the initial barrier layer 211 may include an electrically conductive material such as titanium nitride. Titanium nitride can prevent the initial conductive layer from penetrating into the substrate, and meanwhile can achieve electrical connection between the initial conductive layer 212 and the plurality of active area 11 of the substrate 10.

The initial conductive layer 212 is arranged on a surface of the initial barrier layer 211 facing away from the substrate 10. A material of the initial conductive layer 212 may include an electrically conductive material such as tungsten. The initial conductive layer 212 is employed to achieve electrical connection between the plurality of active area 11 and other structures. For example, the initial conductive layer is employed to achieve the electrical connection between the plurality of active area and a capacitor.

The initial insulating layer 213 is arranged on a surface of the initial conductive layer 212 facing away from the initial barrier layer 211. A material of the initial insulating layer 213 may include an insulating material such as silicon nitride. Electrical connection between the initial conductive layer 212 and other electrically conductive structures arranged on the initial insulating layer 213 is implemented by means of the initial insulating layer 213.

Step S220: patterning the initial mask layer to form the plurality of first mask layers arranged at intervals.

With continued reference to FIG. 3 and FIG. 4, the second photoresist layer 23 may be formed on the initial mask layer 22. That is, the second photoresist layer 23 with a certain thickness may be formed on the initial mask layer 22 by means of a coating process.

Figure 5:
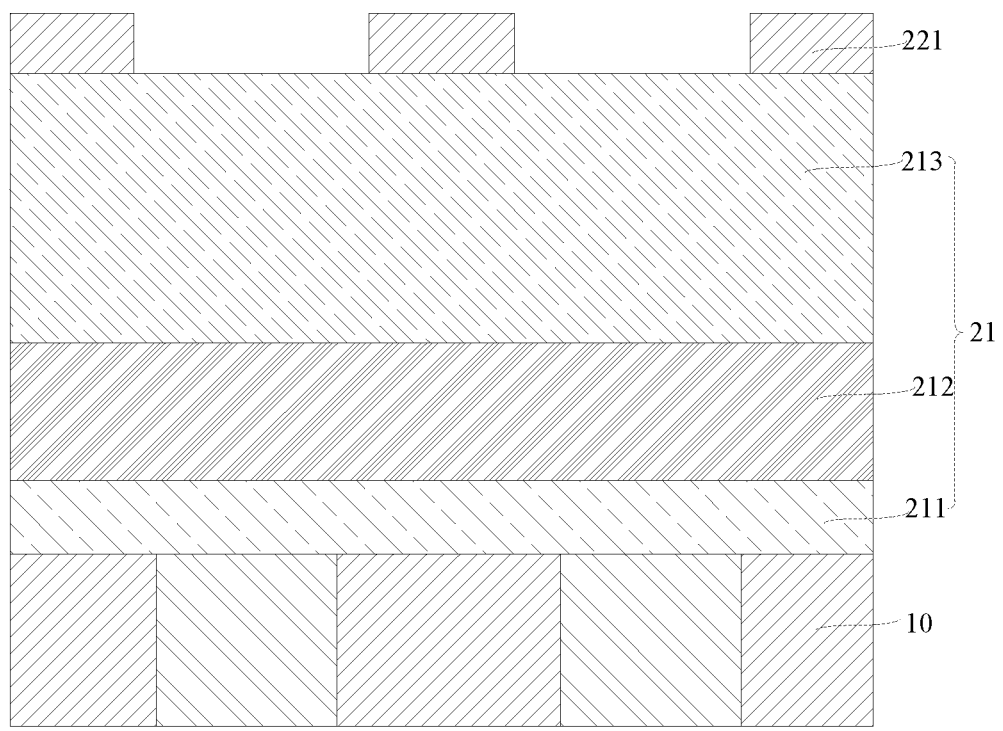
FIG. 5 is a schematic structural diagram of a plurality of first mask layers formed in the method for fabricating a semiconductor structure according to an embodiment of the present disclosure.

The second photoresist layer 23 is patterned, such that a plurality of second shielding portions arranged at intervals are formed on the second photoresist layer, and a second opening is formed between adjacent two of the plurality of second shielding portions, wherein the second photoresist layer 23 is a negative photoresist. The initial mask layer 22 under the plurality of second shielding portions is removed by means of an etching gas or an etching solution, to form the plurality of first mask layers 221 arranged at intervals, wherein structures of the plurality of first mask layers 221 are as shown in FIG. 5.

In this embodiment, a material of the initial mask layer 22 may include materials such as polysilicon. An etching ratio of the polysilicon is greater than that of silicon nitride, which is used as an etching barrier layer of the initial insulating layer.

It is to be noted that the initial mask layer 22 in this embodiment may be interpreted as an entire surface (not having been etched yet) formed on the initial bit line layer 21 by means of the atomic layer deposition process, the chemical vapor deposition process, or the physical vapor deposition process. Similarly, concepts of the initial barrier layer 211, the initial conductive layer 212 and the initial insulating layer 213 are the same as the concept of the initial mask layer 22, and thus are not to be repeated in this embodiment.

Step S230: etching the initial bit line layer by using the plurality of first mask layers as masks, to form the plurality of bit lines arranged at intervals on the substrate.

Figure 6:
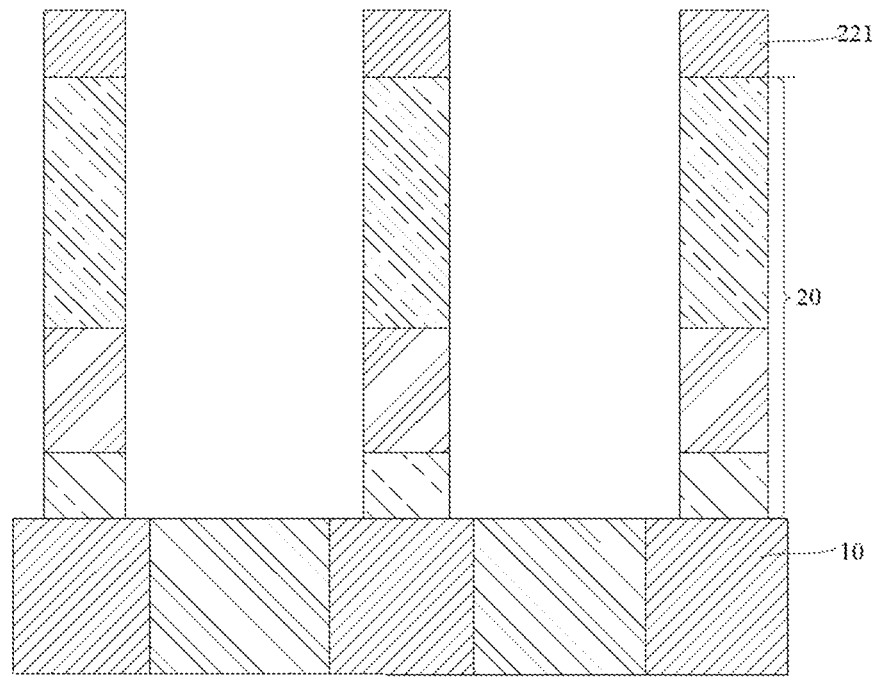
FIG. 6 is a schematic structural diagram of a plurality of bit lines formed in the method for fabricating a semiconductor structure according to an embodiment of the present disclosure.

As shown in FIG. 6, the initial insulating layer 213, the initial conductive layer 212 and the initial barrier layer 211 that are exposed between the adjacent first mask layers 221 are removed by means of the etching gas or the etching solution, and the initial insulating layer 213, the initial conductive layer 212 and the initial barrier layer 211 that are remained on the substrate 10 form the plurality of bit lines 20, wherein the plurality of bit lines 20 are arranged at intervals on the substrate 10.

Step S300: forming a first dielectric layer on the substrate positioned between adjacent two of the plurality of bit lines, the first dielectric layer covering the plurality of bit lines and the substrate.

Figure 7:
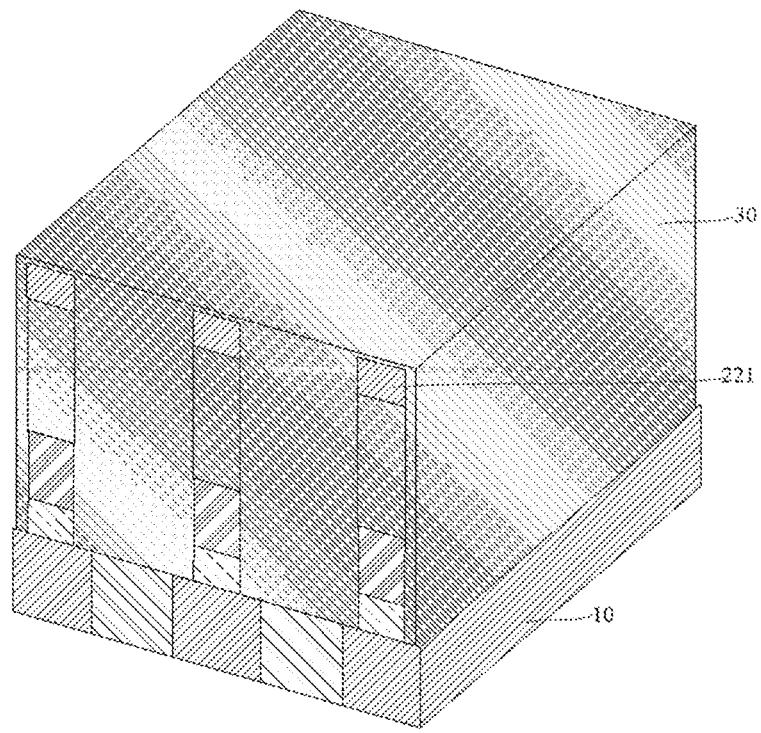
FIG. 7 is a three-dimensional diagram of a first dielectric layer formed in the method for fabricating a semiconductor structure according to an embodiment of the present disclosure.
Figure 8:
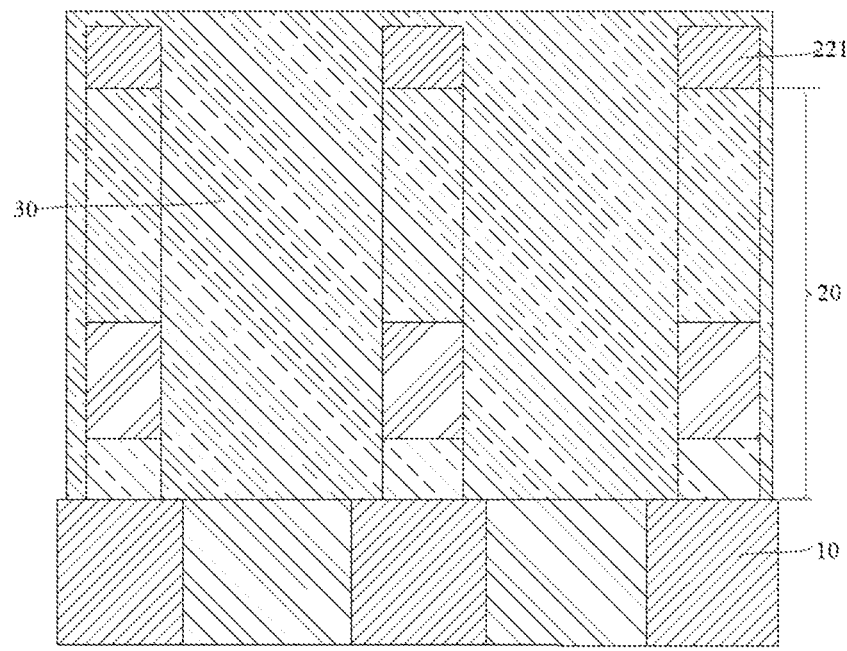
FIG. 8 is a principal view of FIG. 7.

As shown in FIG. 7 and FIG. 8, in some embodiments, silicon nitride may be deposited on the substrate 10 by the atomic layer deposition process, the chemical vapor deposition process, or the physical vapor deposition process. Silicon nitride covers the plurality of bit lines 20 and the first mask layer 221, to form the first dielectric layer 30. In the atomic layer deposition process, the gas may be ammonia gas or a mixed gas of nitrogen gas and hydrogen gas.

Step S400: patterning the first dielectric layer, to form a plurality of first notches arranged at intervals on the first dielectric layer.

Figure 9:
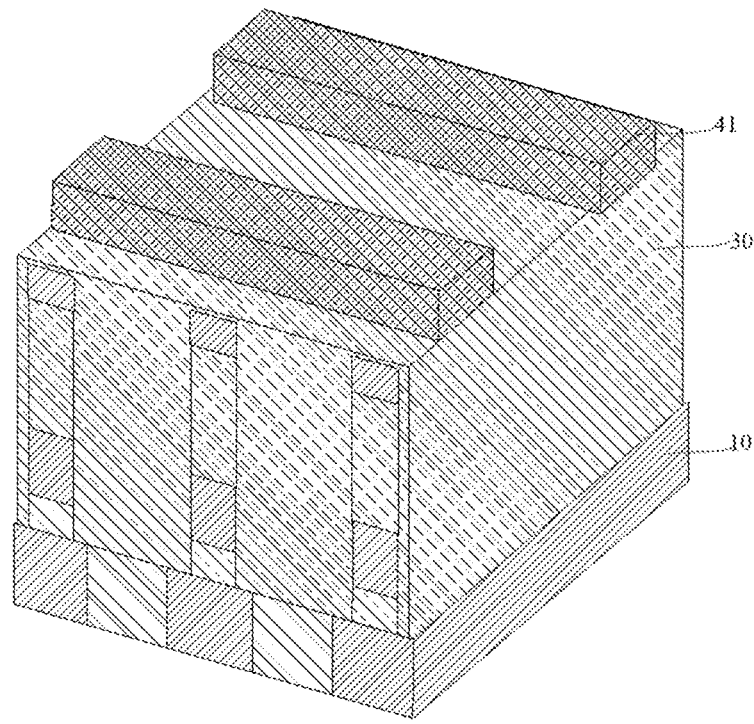
FIG. 9 is a schematic structural diagram of a first photoresist layer patterned in the method for fabricating a semiconductor structure according to an embodiment of the present disclosure.

Exemplarily, as shown in FIG. 9, a first photoresist layer 40 is formed on the first dielectric layer 30. That is, the first photoresist layer 40 may be formed on the surface of the first dielectric layer 30 facing away from the substrate 10 by means of coating.

Figure 10:
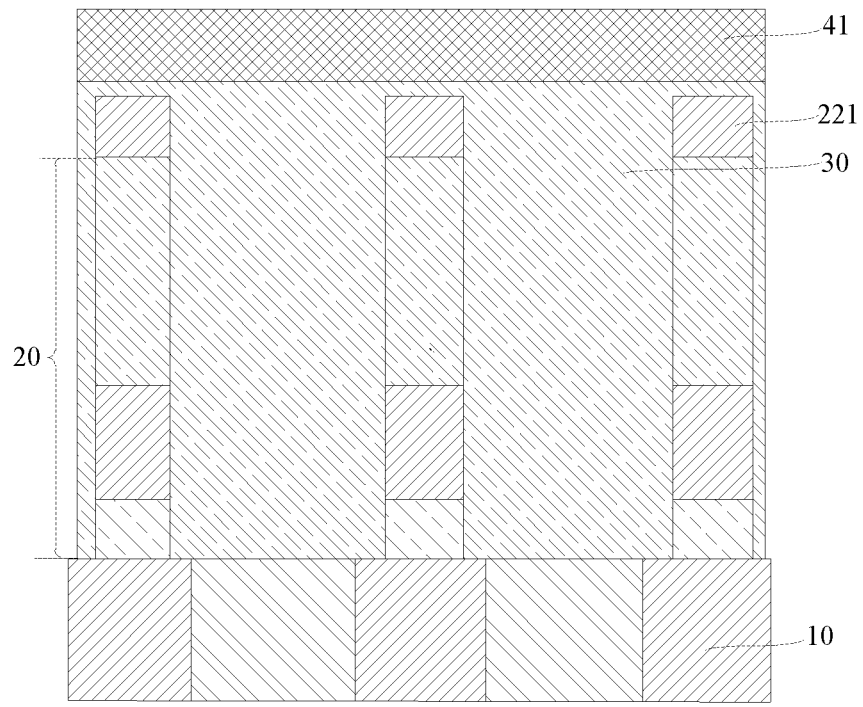
FIG. 10 is a principal view of FIG. 9.
Figure 11:
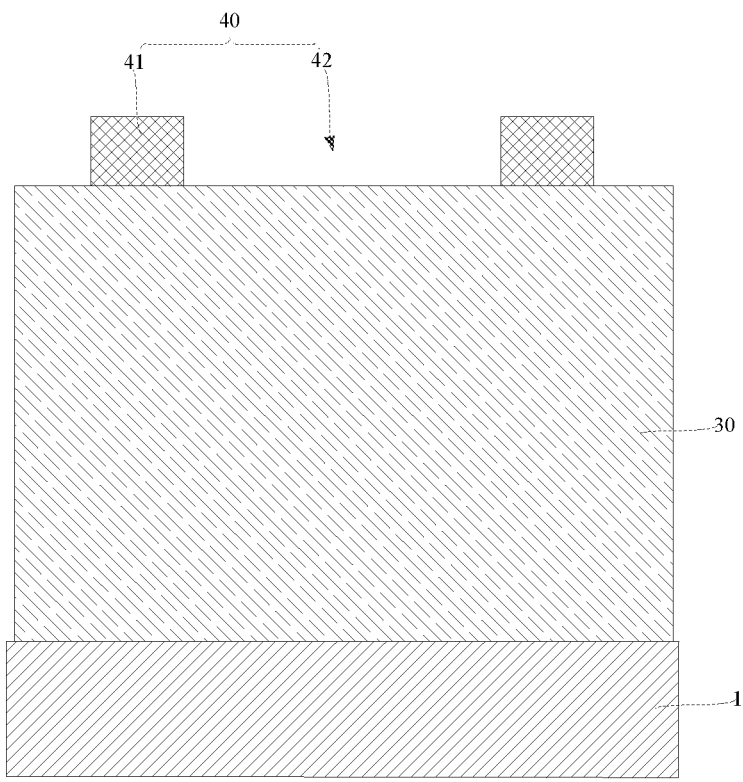
FIG. 11 is a right view of FIG. 9.

As shown in FIG. 10 and FIG. 11, the first photoresist layer 40 is patterned, such that a plurality of first shielding portions 41 arranged at intervals are formed on the first photoresist layer 40, and a first opening 42 is formed between adjacent two of the plurality of first shielding portions 41.

That is, a part of the first photoresist layer 40 is removed by means of exposure, development or etching, and the remaining first photoresist layer 40 forms the plurality of first shielding portions 41. An orthographic projection of the plurality of first shielding portions 41 on the substrate 10 is perpendicular to an orthographic projection of the plurality of bit lines 20 on the substrate 10, or the orthographic projection of the plurality of first shielding portions 41 on the substrate 10 is perpendicular to an extension direction of the first mask layer 221.

Figure 12:
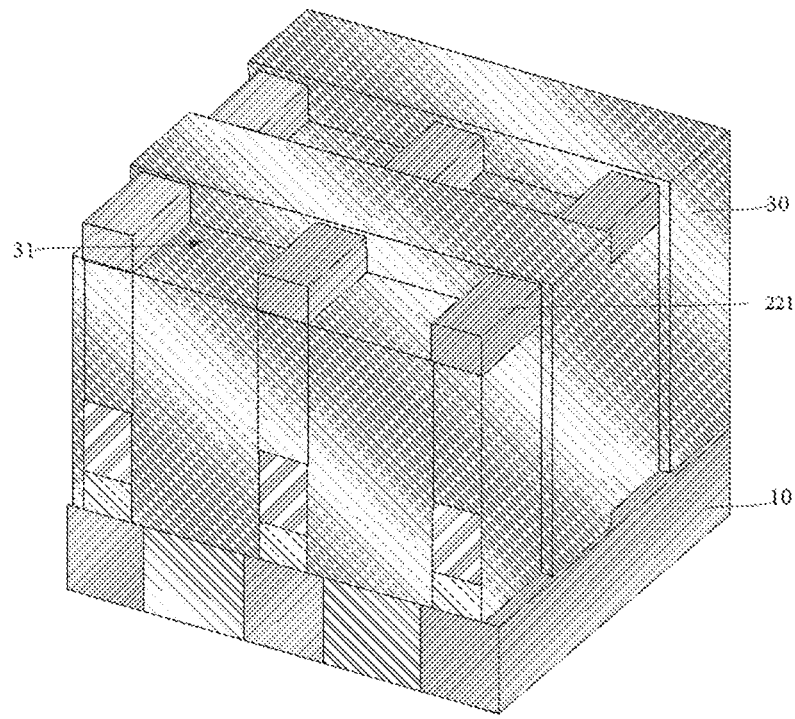
FIG. 12 is a schematic structural diagram of a first dielectric layer patterned in the method for fabricating a semiconductor structure according to an embodiment of the present disclosure.
Figure 13:
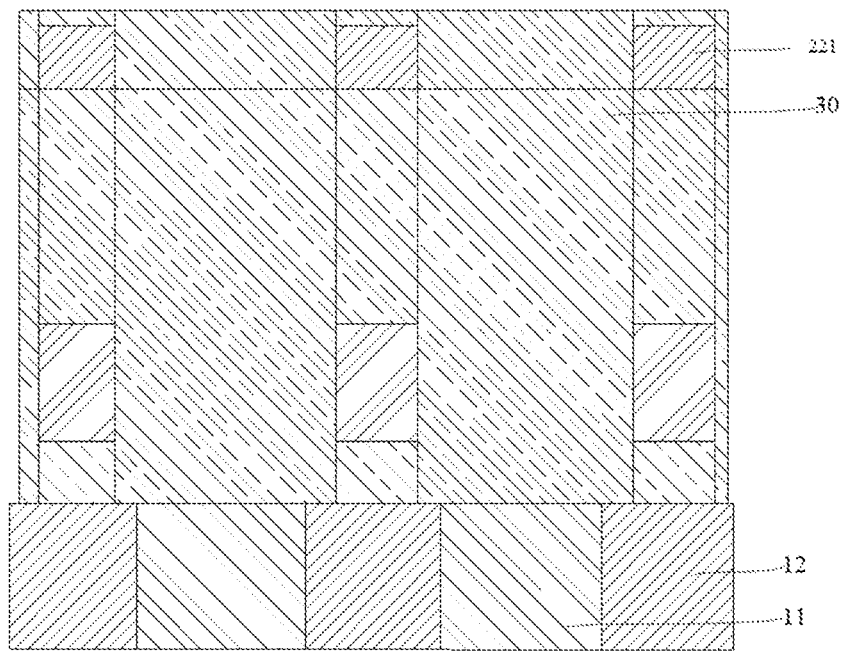
FIG. 13 is a principal view of FIG. 12.

As shown in FIG. 12 and FIG. 13, after the first photoresist layer 40 is patterned, a part of the first dielectric layer 30 exposed in the first opening 42 is etched by using the patterned first photoresist layer 40 as a mask, to form a plurality of first notches 31 arranged at intervals in the first dielectric layer 30, wherein a notch bottom of each of the plurality of first notches 31 is flush with a bottom surface of the first mask layer 221.

In this step, the etching ratio of the first mask layer 221 is less than that of the first dielectric layer 30, such that an etching rate of the first dielectric layer 30 is greater than that of the first mask layer 221 when the same etching gas or etching solution is employed. Therefore, the plurality of first notches 31 are formed in the first dielectric layer 30, and a part of sidewalls of the plurality of first notches 31 serve as the sidewalls of the first mask layer 221.

After the plurality of first notches 31 are formed in the first dielectric layer 30, the first photoresist layer 40 may be removed by means of a cleaning solution.

Step S500: forming a second mask layer on the first dielectric layer, and the second mask layer encircling in each of the plurality of first notches to form a second notch.

Figure 14:
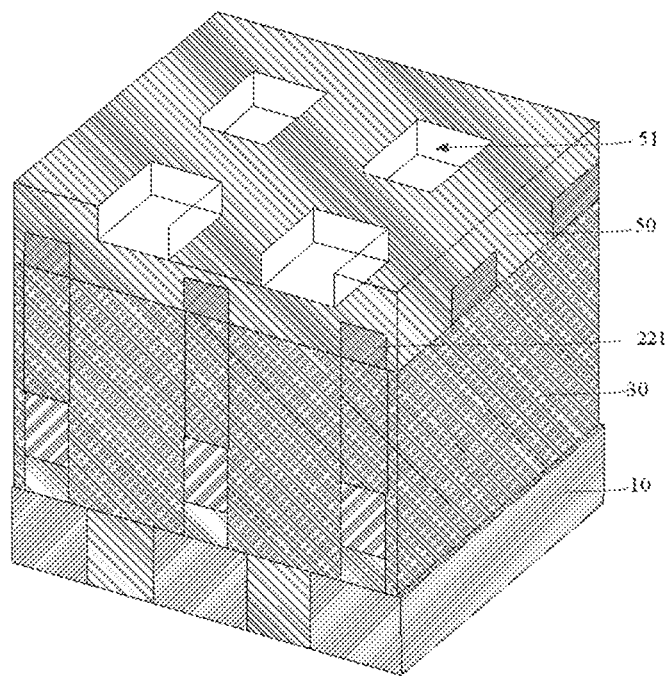
FIG. 14 is a three-dimensional diagram of a second mask layer formed in the method for fabricating a semiconductor structure according to an embodiment of the present disclosure.
Figure 15:
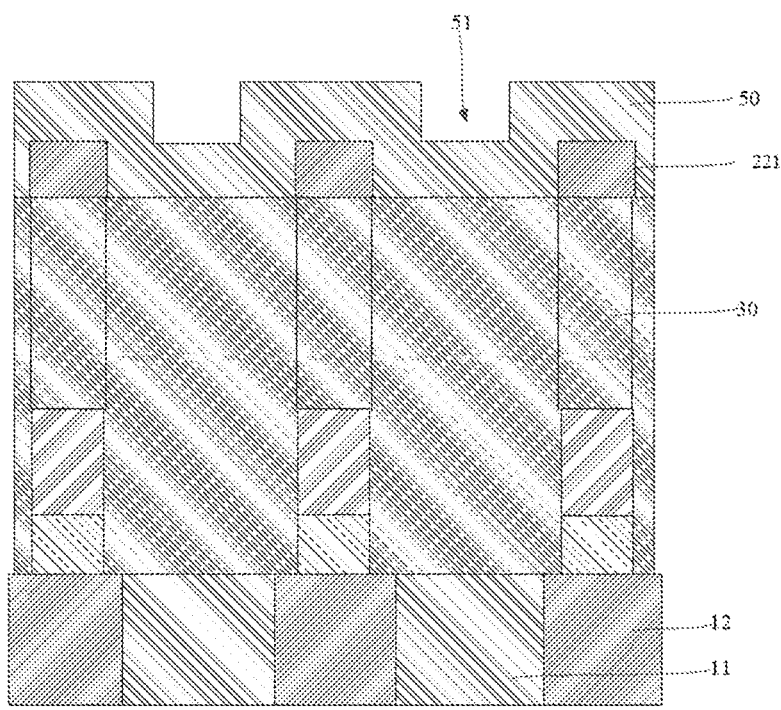
FIG. 15 is a principal view of FIG. 14.

In some embodiments, as shown in FIG. 14 and FIG. 15, a second mask layer 50 is formed on the inner wall of each of the plurality of first notches 31 by means of the atomic layer deposition process, and the second mask layer 50 extends to outside of each of the plurality of first notches 31 and covers the first dielectric layer 30. That is, the second mask layer 50 forms a second notch 51 in each of the plurality of first notches 31, and the shape and the size of each of the plurality of contact holes may be defined by means of the second notch 51.

In this embodiment, the second mask layer 50 may be formed in each of the plurality of first notches 31 by means of the atomic layer deposition process, such that nano-scale ultra-thin film deposition can be implemented in an accurate control manner, and a thickness of the second mask layer 50 can be accurately controlled, and thus the size and the shape of the second notch 51 can be accurately controlled.

To facilitate accurate control of the shape of each of the plurality of contact holes formed subsequently, the shape of the second notch is also defined in this embodiment. For example, taking a plane parallel to the substrate 10 as a cross section, a cross-sectional shape of the second notch 52 is a square. Exemplarily, the cross-sectional shape of the second notch 52 is a square.

Further, a ratio of a width of the second notch 51 to a width of each of the plurality of first notches 31 is between ⅓ and ½. The width of the second notch 51 may be reduced if the ratio of the width of the second notch 51 to the width of each of the plurality of first notches 31 is less than ⅓, accordingly an area of the conductive plunger formed in the second notch may be reduced, and further, the conductive performance of the conductive plunger may be reduced, thereby having a negative effect on service performance of the semiconductor structure. The width of the second notch 51 may be increased if the ratio of the width of the second notch 51 to the width of each of the plurality of first notches 31 is more than ½, accordingly a distance between the conductive plunger and each of the plurality of bit lines 20 may be reduced, which may likely cause an electrical connection formed between the conductive plunger and each of the plurality of bit lines 20, and break down the adjacent active area 11, thereby having a negative effect on utilization of the semiconductor structure.

Therefore, the ratio of the width of the second notch to the width of each of the plurality of first notches is limited in this embodiment, and the shape of each of the plurality of contact holes is limited. In this way, it can be prevented the conductive plunger from breaking down the adjacent active area, thereby ensuring that the service performance of the semiconductor structure.

Step S600: removing the first dielectric layer positioned under the second notch to form the plurality of contact holes arranged at intervals in the first dielectric layer, each of the plurality of contact holes extending into the substrate to expose a part of the plurality of active area.

Figure 16:
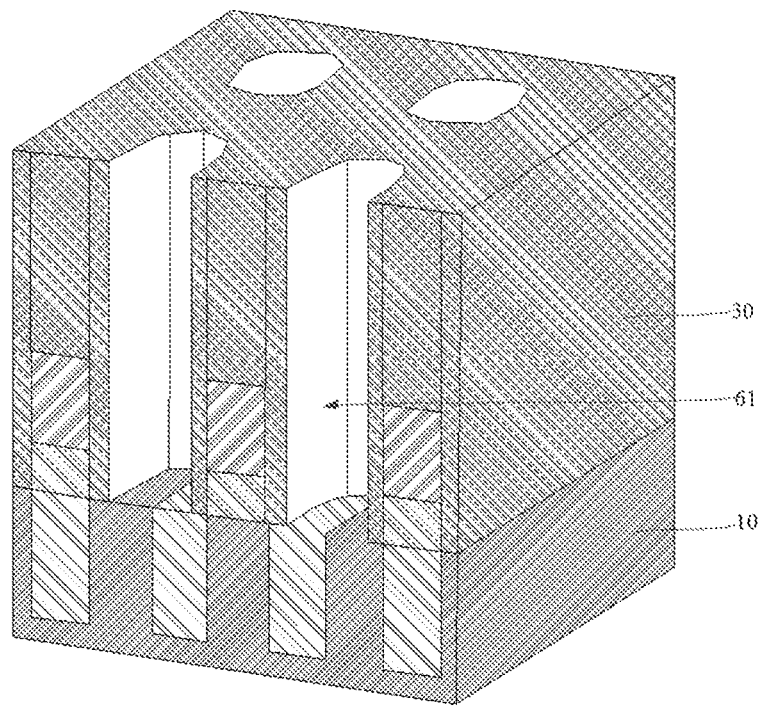
FIG. 16 is a three-dimensional diagram of a first intermediate hole formed in the method for fabricating a semiconductor structure according to an embodiment of the present disclosure.
Figure 17:
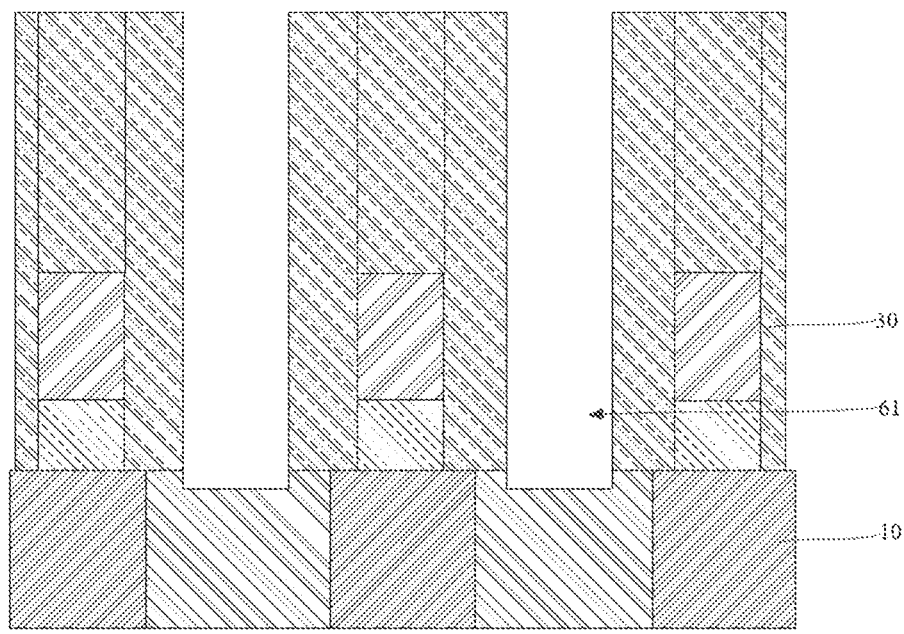
FIG. 17 is a principal view of FIG. 16.

In some embodiments, as shown in FIG. 16 and FIG. 17, a first intermediate hole 61 is formed in the first dielectric layer 30 by using the second mask layer 50 is as a mask. The second mask layer 50 is removed, and the second mask layer 50 and the first dielectric layer 30 positioned under the second notch 51 are removed by means of a dry etching process, such that a first intermediate hole 61 is formed in the first dielectric layer 30. The etching ratio of the first mask layer 221 is smaller than that of the second mask layer 50, and the first mask layer 221 may be used as an etching stop layer. Therefore, during the etching process, the first dielectric layer 30 positioned under the second notch 51 may be etched, to form the first intermediate hole 61 in the first dielectric layer 30.

After the first intermediate hole 61 is formed, a second intermediate hole 62 may be further formed by means of following two implementations, and process steps are as follows.

Figure 18:
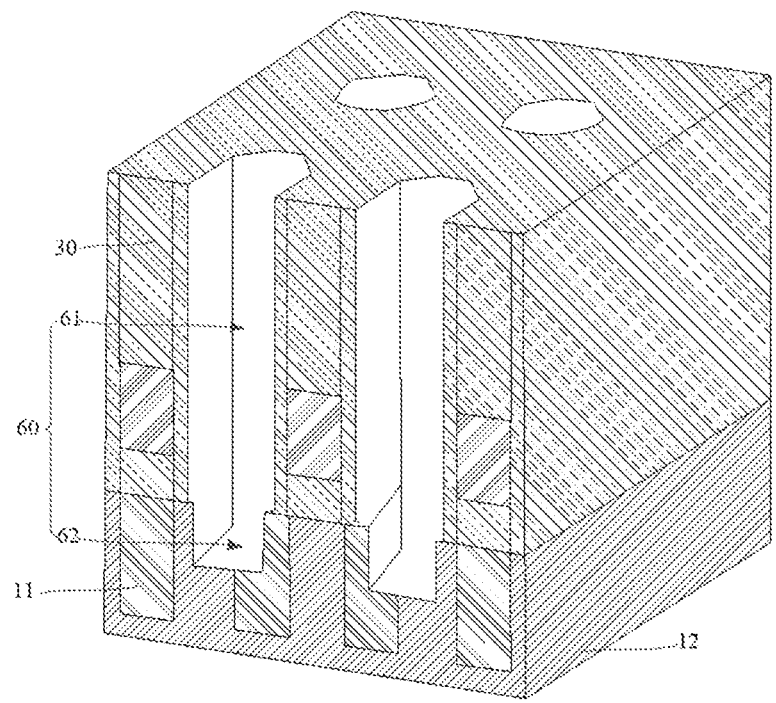
FIG. 18 is a three-dimensional diagram of a second intermediate hole formed in the method for fabricating a semiconductor structure according to an embodiment of the present disclosure.
Figure 19:
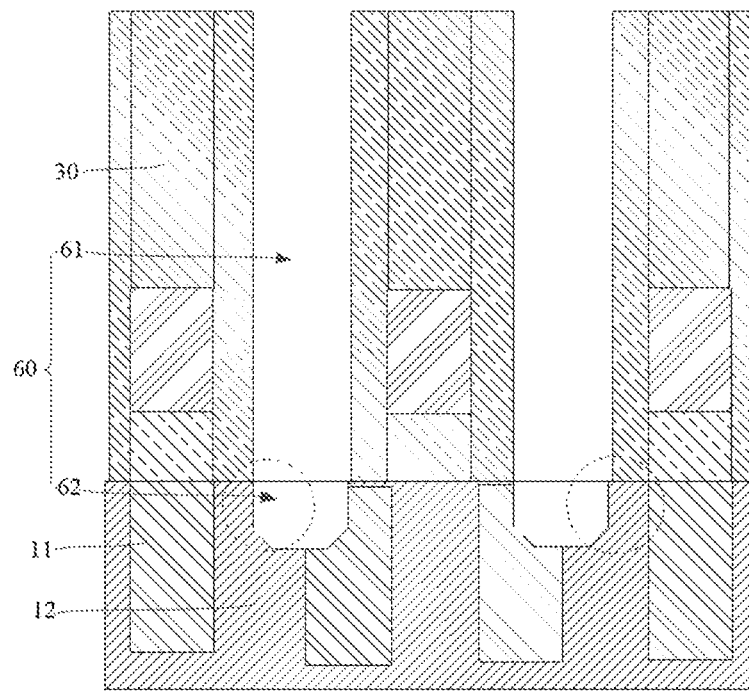
FIG. 19 is a principal view of FIG. 18.
Figure 20:
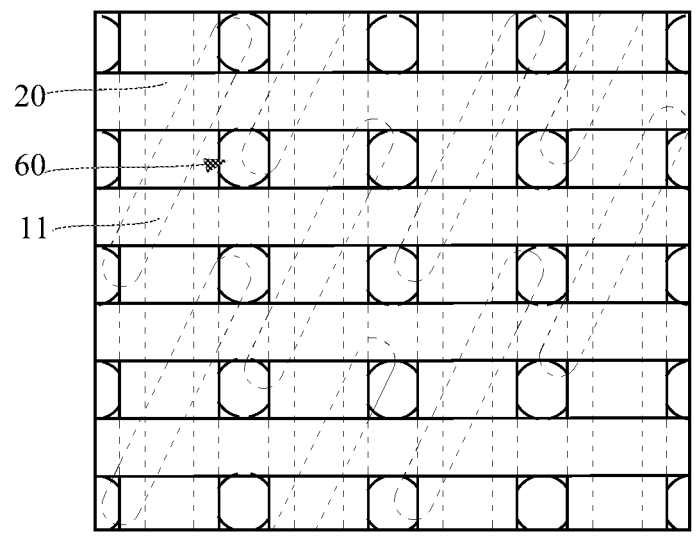
FIG. 20 is a vertical view of FIG. 18.

In one of the two implementations, as shown in FIG. 18, FIG. 19, and FIG. 20, a part of the substrate 10 exposed in the first intermediate hole 61 is removed by means of the dry etching process to form the second intermediate hole 62 in the substrate 10. The first intermediate hole 61 and the second intermediate hole 62 constitute each of the plurality of contact holes 60. The plurality of contact holes 60 may expose a part of the plurality of active area 11, such that the conductive plug formed in each of the plurality of contact holes 60 is electrically connected to each of the plurality of active area 11.

Figure 21:
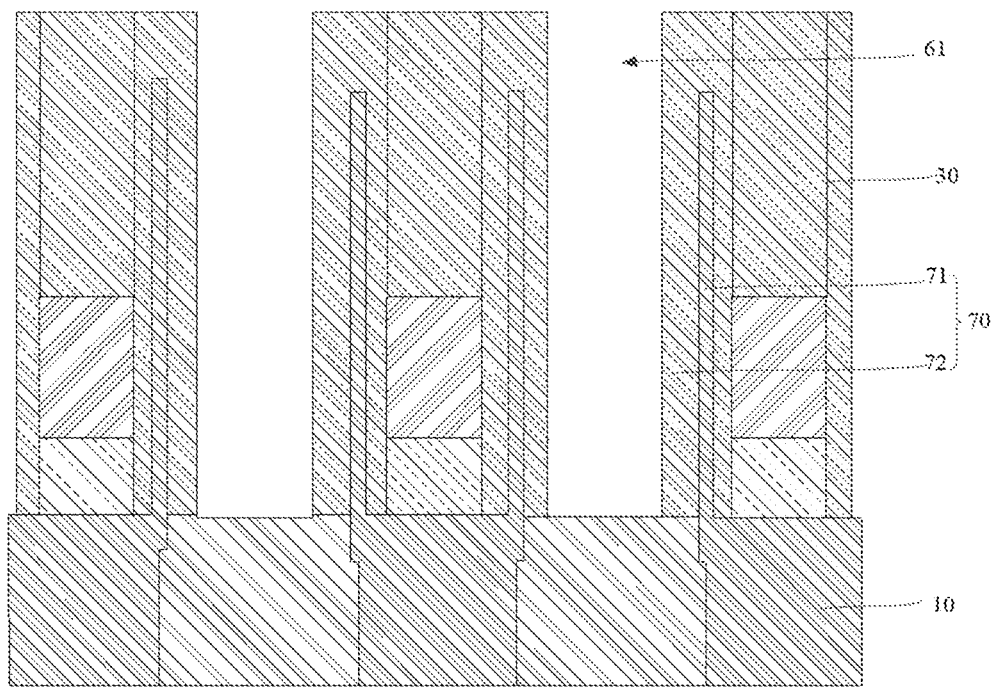
FIG. 21 is a schematic structural diagram of a second dielectric layer formed in the method for fabricating a semiconductor structure according to an embodiment of the present disclosure.

In the other one of the two implementations, as shown in FIG. 21, a second dielectric layer 70 is formed on a side wall of the first intermediate hole 61, and the second dielectric layer 70 forms into a circular hole or a polygonal hole, wherein the second dielectric layer 70 may be a stacked structure. For example, the second dielectric layer 70 may include a silicon oxide layer 71 and a silicon nitride layer 72. In some embodiments, the silicon oxide layer 71 is formed on a sidewall of the first intermediate hole by means of the atomic layer deposition process, and then the silicon nitride layer 72 is formed on the silicon oxide layer 71 by means of the atomic layer deposition process again. In this way, an isolation spacer between each of the plurality of bit lines and the conductive plunger includes a three-layer structure. Along a perpendicular direction directing one of the plurality of bit lines to another one of the plurality of bit lines, the isolation spacer sequentially includes: a silicon nitride layer-a silicon oxide layer-a silicon nitride layer.

After the first intermediate hole 61 is formed, a part of the substrate 10 exposed in the first intermediate hole 61 is removed by means of the dry etching process to form the second intermediate hole 62 in the substrate 10, wherein the first intermediate hole 61 and the second intermediate hole 62 constitute each of the plurality of contact holes 60.

In this embodiment, no matter in which one of the above implementations is the second intermediate hole 62 formed, taking a plane parallel to the substrate 10 as a cross section, cross-sectional shapes of the first intermediate hole 61 and the second intermediate hole 62 are circles or polygons. That is, the cross-sectional shapes of the plurality of contact holes 60 are either circles or polygons, wherein the polygons may be regular polygons such as squares or regular pentagons.

In this embodiment, a plurality of polygonal contact holes are formed. That is, adjacent inner wall surfaces of the plurality of contact holes formed are curved surfaces. Based on such an arrangement, a surface area of the plurality of contact holes can be increased, it may be prevented the plurality of contact holes from exposing two adjacent active area, thereby preventing electrical connection between the adjacent active area from being caused by the conductive plungers formed subsequently. In this way, the service performance of the semiconductor structure is ensured.

After the step of removing a part of the substrate exposed in the first intermediate hole by means of dry etching, to form a second intermediate hole in the substrate, the first intermediate hole and the second intermediate hole constituting each of the plurality of contact holes, the method for fabricating a semiconductor structure also includes: removing the first mask layer 221 by means of dry etching.

It is to be noted that in this embodiment, the etching gas for dry etching may include at least one of $SF_6$, $CF_4$, $CHF_3$, $Cl_2$, and Ar. That is, the etching gas for dry etching may be a single gas or may be a mixed gas of two or more of the above gases.

Step S700: forming a conductive plunger in each of the plurality of contact holes, the conductive plunger being in contact with each of the plurality of active area.

Figure 22:
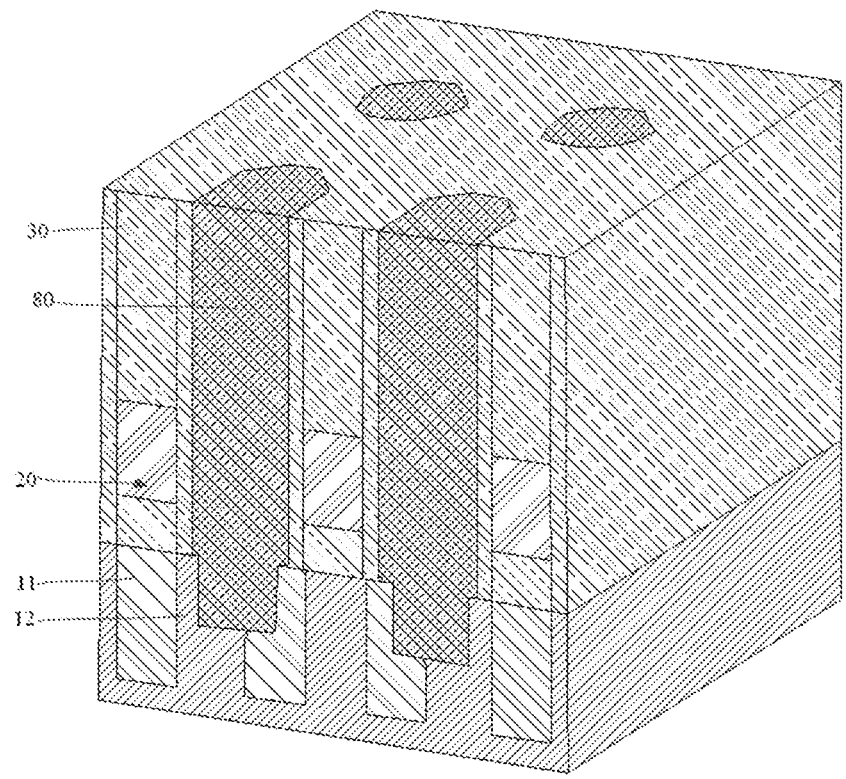
FIG. 22 is a three-dimensional diagram of a conductive plunger formed in the method for fabricating a semiconductor structure according to an embodiment of the present disclosure.
Figure 23:
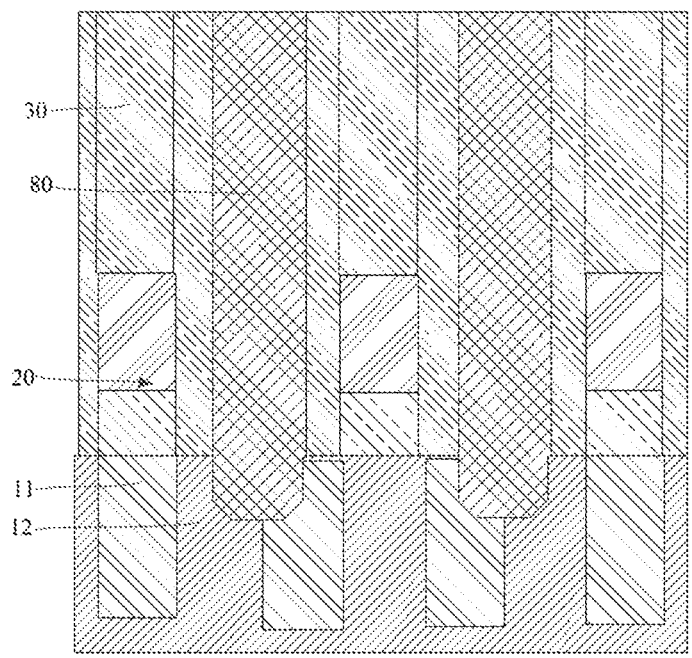
FIG. 23 is a principal view of FIG. 22.
Figure 24:
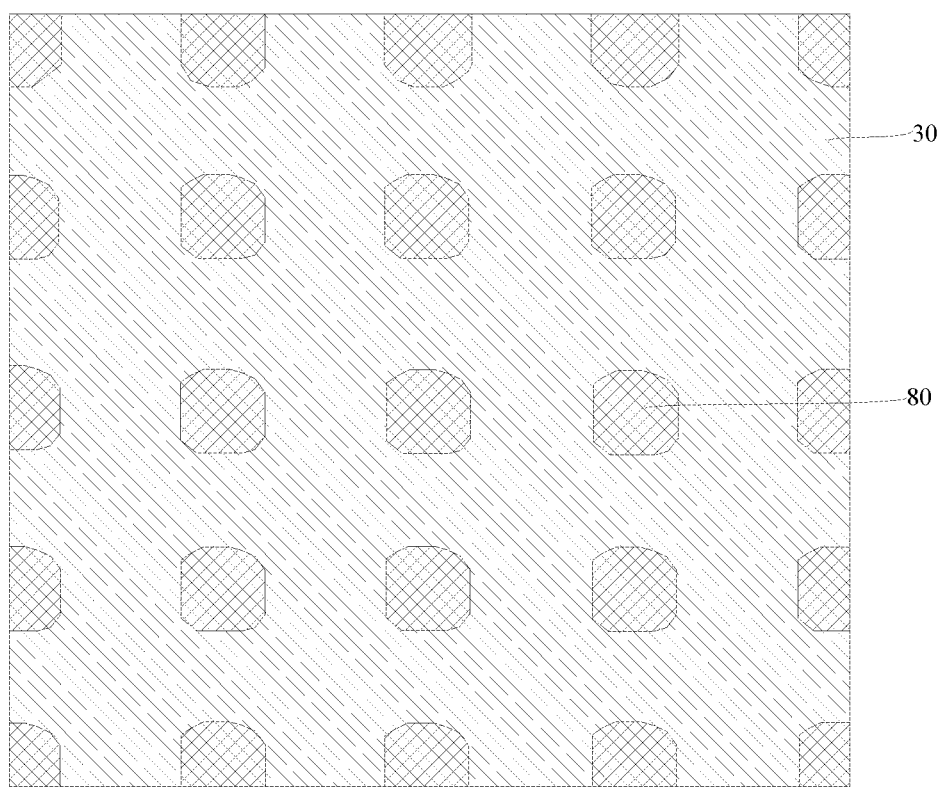
FIG. 24 is a vertical view of FIG. 22.

As shown in FIG. 22 to FIG. 24, polysilicon is deposited in each of the plurality of contact holes 60 by means of the chemical vapor deposition process. The polysilicon fills up each of the plurality of contact holes 60 to form a conductive plunger 80. One terminal of the conductive plunger 80 is in contact with each of the plurality of active area 11, and the other terminal of the conductive plunger 80 is connected to a capacitor arranged on the substrate, such that the capacitor can store and read data.

The second aspect of the embodiments of the present disclosure also provides a semiconductor structure, which is fabricated by means of the method for fabricating a semiconductor structure in the above-mentioned embodiments. The structure of the semiconductor structure is as shown in FIG. 22 and FIG. 23.

The semiconductor structure may include a substrate 10, a plurality of bit lines 20, and a first dielectric layer 30. The substrate 10 is provided with a plurality of active area 11 arranged at intervals, and an isolation structure 12 configured to isolate the plurality of active area 11. The isolation structure 12 can implement insulation between the plurality of active area 11.

The plurality of bit lines 20 are arranged on the substrate 10, and a part of bottom walls of the plurality of bit lines 20 are in contact with the plurality of active area 11. Each of the plurality of bit lines 20 may include a barrier layer, a conductive layer and an insulating layer sequentially arranged from bottom to top on the substrate.

The first dielectric layer 30 covers the plurality of bit lines 20 and the substrate 10, the first dielectric layer 30 positioned between adjacent two of the plurality of bit lines 20 is internally provided with a plurality of contact holes 60 arranged at intervals, and the plurality of contact holes 60 extend into the substrate 10 to expose a part of the plurality of active area 11.

The conductive plunger 80 is arranged in each of the plurality of contact holes 60. Taking a plane parallel to the substrate 10 as a cross section, a cross-sectional shape of the conductive plunger 80 is a circle or a polygon. The structure of the conductive plunger 80 is as shown in FIG. 24.

In this embodiment, the first dielectric layer covering the plurality of bit lines and the substrate is formed on the substrate, and the plurality of contact holes for arranging the conductive plunger are formed in the first dielectric layer. In this way, the first dielectric layer not only can serve as an isolation spacer between adjacent two of the plurality of bit lines, but also can serve as an isolation structure between the adjacent conductive plungers, such that fabrication processes of the conductive plungers can be simplified, and production costs can be reduced.

In addition, in some embodiments of the present disclosure, the second mask layer is also formed on the first dielectric layer, and the second notch is formed in each of the plurality of first notches. A size and a shape of the conductive plunger are defined by means of the second notch, to facilitate forming the plurality of off-round contact holes, and then forming the off-round conductive plunger. Compared with the rectangular conductive plunger in the related technologies, the size of the conductive plunger can be reduced, and electric leakage at corners of the conductive plunger can be prevented.

The embodiments or the implementations in the specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the implementations or example are included in at least one implementation or example of the present disclosure.

The schematic representation of the above terms throughout this specification is not necessarily referring to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
    providing a substrate, the substrate comprising a plurality of active areas;
    forming a plurality of bit lines arranged at a first interval on the substrate, the plurality of bit lines having a plurality of first mask layers;
    forming a first dielectric layer on the substrate positioned between adjacent two of the plurality of bit lines, the first dielectric layer covering the plurality of bit lines and the substrate;
    patterning the first dielectric layer to form a plurality of first notches arranged at a second interval on the first dielectric layer; and, wherein the patterning of the first dielectric layer comprises: forming a first photoresist layer on the first dielectric layer, patterning the first photoresist layer, such that a plurality of first shielding portions arranged at a third interval are formed on the first photoresist layer, and a first opening is formed between adjacent two of the plurality of first shielding portions;
    forming a second mask layer on the first dielectric layer, and the second mask layer encircling in each of the plurality of first notches to form a plurality of second notches;
    removing the first dielectric layer positioned under the plurality of second notches to form a plurality of contact holes arranged at a fourth interval in the first dielectric layer, each of the plurality of contact holes extending into the substrate to expose a part of the plurality of active areas; and
    forming a plurality of conductive plungers in the plurality of contact holes, wherein each of the plurality of conductive plungers is in contact with a corresponding active area of the plurality of active areas.

2. The method for fabricating the semiconductor structure of claim 1, wherein the forming the plurality of bit lines arranged at the first interval on the substrate comprises:
    sequentially forming an initial bit line layer and an initial mask layer from bottom to top on the substrate;
    patterning the initial mask layer to form the plurality of first mask layers arranged at a fifth interval; and
    etching the initial bit line layer by using the plurality of first mask layers as masks, to form the plurality of bit lines arranged at the first interval on the substrate.

3. The method for fabricating the semiconductor structure of claim 2, wherein the sequentially forming the initial bit line layer and the initial mask layer from bottom to top on the substrate comprises:
    sequentially forming an initial barrier layer, an initial conductive layer and an initial insulating layer from bottom to top on the substrate, wherein the initial barrier layer, the initial conductive layer and the initial insulating layer constitute the initial bit line layer.

4. The method for fabricating the semiconductor structure of claim 3, wherein the patterning the initial mask layer to form the plurality of first mask layers arranged at the fifth interval comprises:
    forming a second photoresist layer on the initial mask layer;
    patterning the second photoresist layer, such that a plurality of second shielding portions arranged at a sixth interval are formed on the initial mask layer, and a second opening is formed between adjacent two of the plurality of second shielding portions, wherein each of the plurality of second shielding portions is laterally offset from a region in which the plurality of bit lines are formed; and
    removing the initial mask layer exposed in the second opening, wherein the initial mask layer remained constitutes each of the plurality of first mask layers.

5. The method for fabricating the semiconductor structure of claim 4, wherein a material of the initial conductive layer comprises tungsten, a material of the initial barrier layer comprising titanium nitride, the initial barrier layer being configured to prevent an electrically conductive material of the initial conductive layer from diffusing into the substrate.

6. The method for fabricating the semiconductor structure of claim 1, wherein the patterning the first dielectric layer further comprises:
    etching a part of the first dielectric layer exposed in the first opening to form the plurality of first notches arranged at the second interval on the first dielectric layer, a bottom portion of each of the plurality of first notches being flush with a bottom surface of each of the plurality of first mask layers; and
    removing the first photoresist layer;
    wherein the forming of the second mask layer on the first dielectric layer comprises:
    forming the second mask layer on an inner wall of each of the plurality of first notches, the second mask layer extending to outside of each of the plurality of first notches and covering the first dielectric layer.

7. The method for fabricating the semiconductor structure of claim 6, wherein the forming the second mask layer on the inner wall of each of the plurality of first notches comprises:
    forming the second mask layer on the inner wall of each of the plurality of first notches by an atomic layer deposition process, wherein taking a plane parallel to the substrate as a cross section, a cross-sectional shape of each of the plurality of second notches is a square.

8. The method for fabricating the semiconductor structure of claim 7, wherein a ratio of a width of each of the plurality of second notches to a width of each of the plurality of first notches is between ⅓ and ½.

9. The method for fabricating the semiconductor structure of claim 1, wherein the removing the first dielectric layer positioned under the plurality of second notches to form the plurality of contact holes arranged at the fourth interval in the first dielectric layer comprises:
    forming a plurality of first intermediate holes in the first dielectric layer by using the second mask layer as a mask; and
    removing a part of the substrate exposed in the plurality of first intermediate holes by a first dry etching, to form a plurality of second intermediate holes in the substrate, the plurality of first intermediate holes and the plurality of second intermediate holes constituting each of the plurality of contact holes.

10. The method for fabricating the semiconductor structure of claim 9, wherein taking a plane parallel to the substrate as a cross section, cross-sectional shapes of each of the plurality of first intermediate holes and each of the plurality of second intermediate holes are circles or polygons.

11. The method for fabricating the semiconductor structure of claim 9, wherein after removing the part of the substrate exposed in the plurality of first intermediate holes by the first dry etching, to form the plurality of second intermediate holes in the substrate, the plurality of first intermediate holes and the plurality of second intermediate holes constituting each of the plurality of contact holes, the method further comprises:
   removing the plurality of first mask layers and the second mask layer by a second dry etching.

12. The method for fabricating the semiconductor structure of claim 11, wherein an etching gas in the first dry etching and the second dry etching comprises at least one of $SF_6$, $CF_4$, $CHF_3$, $Cl_2$ and Ar.

13. The method for fabricating the semiconductor structure of claim 1, wherein the removing the first dielectric layer positioned under the plurality of second notches to form the plurality of contact holes arranged at the fourth interval in the first dielectric layer comprises:
   forming a first intermediate hole in the first dielectric layer by using the second mask layer as a mask;
   forming a second dielectric layer on a side wall of the first intermediate hole, the second dielectric layer forming into a circular hole or a polygonal hole;
   removing a part of the substrate exposed in the first intermediate hole by a first dry etching, to form a second intermediate hole in the substrate, the first intermediate hole and the second intermediate hole constituting each of the plurality of contact holes.

14. The method for fabricating the semiconductor structure of claim 13, wherein the second dielectric layer comprises a silicon oxide layer and a silicon nitride layer arranged in stack, the silicon oxide layer being arranged on the side wall of the first intermediate hole.

15. The method for fabricating the semiconductor structure of claim 1, wherein a material of the conductive plunger comprises polysilicon.

* * * * *